(12) United States Patent
Tian et al.

(10) Patent No.: US 11,307,689 B2
(45) Date of Patent: Apr. 19, 2022

(54) DISPLAY PANEL, AND ARRAY SUBSTRATE AND MANUFACTURING THEREOF

(71) Applicant: BOE TECHNOLOGY GROUP CO., LTD., Beijing (CN)

(72) Inventors: Hongwei Tian, Beijing (CN); Yanan Niu, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 16/772,971

(22) PCT Filed: Jan. 6, 2020

(86) PCT No.: PCT/CN2020/070498
§ 371 (c)(1),
(2) Date: Jun. 15, 2020

(87) PCT Pub. No.: WO2020/143582
PCT Pub. Date: Jul. 16, 2020

(65) Prior Publication Data
US 2021/0223896 A1    Jul. 22, 2021

(30) Foreign Application Priority Data
Jan. 8, 2019    (CN) .......................... 201910016840.X

(51) Int. Cl.
*G06F 3/041*    (2006.01)
*H01L 27/12*    (2006.01)

(52) U.S. Cl.
CPC ........ *G06F 3/0412* (2013.01); *H01L 27/1244* (2013.01); *G06F 2203/04102* (2013.01); *G06F 2203/04103* (2013.01)

(58) Field of Classification Search
CPC . G06F 2203/04102; G06F 2203/04103; G06F 3/0412; H01L 27/1244; H01L 27/32
(Continued)

(56) References Cited

U.S. PATENT DOCUMENTS

| 6,885,157 B1 | 4/2005 | Cok et al. |
| 10,381,420 B2 | 8/2019 | Liu et al. |

(Continued)

FOREIGN PATENT DOCUMENTS

| CN | 105845708 A | 8/2016 |
| CN | 106229332 A | 12/2016 |

(Continued)

OTHER PUBLICATIONS

International Search Report and Written Opinion for International Application No. PCT/CN2020/070498 dated Apr. 1, 2020.
(Continued)

*Primary Examiner* — Kwin Xie
(74) *Attorney, Agent, or Firm* — Thomas | Horstemeyer, LLP

(57) ABSTRACT

The present invention provides an array substrate. The array substrate includes: a backplane including a display area and a bonding area; a wiring layer provided on the backplane and exposed in the bonding area; a protective layer provided on a surface of the wiring layer away from the backplane and covering the wiring layer in the display area and the bonding area, wherein a through-hole is provided in the protective layer in the boding area; and a connection layer provided on a surface of the protective layer away from the backplane and coupled to the wiring layer through the through-hole.

18 Claims, 3 Drawing Sheets

(58) Field of Classification Search
USPC .................................................. 345/156–169
See application file for complete search history.

(56) References Cited

U.S. PATENT DOCUMENTS

| | | | | |
|---|---|---|---|---|
| 10,886,348 | B2* | 1/2021 | Kim | ........................ H01L 24/81 |
| 2008/0309633 | A1* | 12/2008 | Hotelling | ............ G06F 3/04166 |
| | | | | 345/173 |
| 2015/0103265 | A1* | 4/2015 | Kim | .................... H01L 27/1248 |
| | | | | 349/12 |
| 2017/0358642 | A1* | 12/2017 | Jo | ........................ H01L 27/3276 |
| 2018/0039125 | A1* | 2/2018 | Kubota | ............. G02F 1/134363 |
| 2018/0226454 | A1 | 8/2018 | Liu et al. | |
| 2018/0294328 | A1 | 10/2018 | Kanaya | |

FOREIGN PATENT DOCUMENTS

| | | | |
|---|---|---|---|
| CN | 106298863 | A | 1/2017 |
| CN | 106775173 | A | 5/2017 |
| CN | 107302016 | A | 10/2017 |
| CN | 107978611 | A | 5/2018 |
| CN | 108010922 | A | 5/2018 |
| CN | 109037282 | A | 12/2018 |
| CN | 106229332 | B | 4/2019 |
| CN | 109742118 | A | 5/2019 |
| CN | 105845708 | B | 7/2019 |
| WO | 2005055329 | A2 | 6/2005 |
| WO | 2005055329 | A3 | 6/2005 |

OTHER PUBLICATIONS

First Office Action for CN Patent Application No. 201910016840.X dated Jun. 10, 2020.

* cited by examiner

DISPLAY PANEL, AND ARRAY SUBSTRATE AND MANUFACTURING THEREOF

CROSS-REFERENCE TO RELATED APPLICATIONS

The present application is a national phase application under 35 U.S.C. § 371 of International Patent Application No. PCT/CN2020/070498, filed on Jan. 6, 2020, which claims the benefit of and priority to Chinese Patent Application No. 201910016840.X, titled "DISPLAY PANEL, AND ARRAY SUBSTRATE AND MANUFACTURING THEREOF" filed on Jan. 8, 2019, the contents of which are incorporated by reference in their entireties herein.

TECHNICAL FIELD

The present disclosure relates to the field of display technology and, in particular, to an array substrate, a display panel including the array substrate, and a manufacturing method of the array substrate.

BACKGROUND

Organic electroluminescent display panels have gradually become mainstream in the display field due to excellent performances such as low power consumption, high color saturation, wide viewing angle, small thickness and flexibility, and can be widely used in terminal products such as smartphones, tablets, and TVs.

Flexible devices in display devices can be made to have any shape and can be arranged in various areas with a small thickness, and thus are becoming more and more important. Current development trends relate to combining a touch electrode, such as flexible metal line on common (FMLOC), and a flexible device.

In the related art, when a FMLOC is combined with the flexible device, a short circuit may occur in a bonding area.

It should be noted that the information disclosed in the above background section is only for enhancing the understanding of the background of the present application and, therefore, may include information that does not constitute the prior art known to those skilled in the art.

SUMMARY

An aspect of the present disclosure provides an array substrate, including:

a backplane including a display area and a bonding area;

a wiring layer provided on the backplane and exposed in the bonding area;

a protective layer provided on a surface of the wiring layer away from the backplane, and covering the wiring layer in the display area and the bonding area, wherein a through-hole is provided in the protective layer in the boding area; and a connection layer provided on a surface of the protective layer away from the backplane, and coupled to the wiring layer through the through-hole.

In an exemplary embodiment of the present disclosure, the array substrate further includes:

a pixel definition layer provided between the wiring layer and the protective layer, and covering the wiring layer in the display area or covering the wiring layer in the display area and the bonding area, wherein a via-hole is provided in the pixel definition layer in the bonding area to be communicated with the through-hole.

In an exemplary embodiment of the present disclosure, the backplane further includes:

a transition area provided between the display area and the bonding area.

In an exemplary embodiment of the present disclosure, the protective layer includes:

a first sub-protective layer covering the display area and the bonding area; and a second sub-protective layer covering the display area or covering the display area and the bonding area.

In an exemplary embodiment of the present disclosure, a plurality of the through-holes are provided.

An aspect of the present disclosure provides a display panel, including the array substrate according to any one of the above.

An aspect of the present disclosure provides a method for manufacturing an array substrate, including:

providing a backplane including a display area and a bonding area;

forming a wiring layer on the backplane to cover the backplane and to be exposed in the bonding area;

forming a protective layer on a surface of the wiring layer away from the backplane to cover the wiring layer in the display area and the bonding area;

forming a through-hole in the protective layer; and forming a connection layer on a surface of the protective layer away from the backplane to be coupled to the wiring layer through the through-hole.

In an exemplary embodiment of the present disclosure, the method for manufacturing an array substrate further includes, after forming the wiring layer:

forming a pixel definition layer on a surface of the wiring layer away from the backplane to cover the wiring layer in the display area or cover the wiring layer in the display area and the boding area; and forming a via-hole in the pixel definition layer in the bonding area to be communicated with the through-hole.

In an exemplary embodiment of the present disclosure, the backplane further includes:

a transition area provided between the display area and the bonding area.

In an exemplary embodiment of the present disclosure, forming the protective layer on the surface of the wiring layer away from the backplane includes:

forming a first sub-protective layer on the surface of the wiring layer away from the backplane to cover the display area and the bonding area; and forming a second sub-protective layer on a surface of the first sub-protective layer away from the backplane to cover the display area or cover the display area and the bonding area.

BRIEF DESCRIPTION OF THE DRAWINGS

The above and other features and advantages of the present disclosure will become more apparent by describing in detail exemplary embodiments with reference to the accompanying drawings.

DETAILED DESCRIPTION

Figure 1:
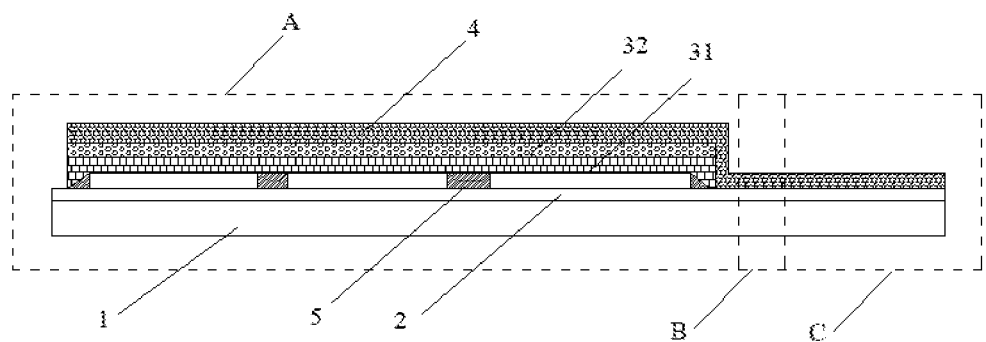
FIG. 1 is a schematic structural diagram of an array substrate in the related art.

Example embodiments will now be described more fully with reference to the drawings. However, the example embodiments can be implemented in various forms, and should not be construed as being limited to embodiments set forth herein. On the contrary, these embodiments are provided so that the present disclosure is comprehensive and complete, and fully convey the concept of the example embodiments to those skilled in the art. The same reference numerals in the drawings denote the same or similar structures, and thus their detailed description will be omitted.

Currently, touch functionality is widely used, and nearly exists in all modern display devices. However, at present, generally, a touch sensor panel (TSP) (i.e., an externally-attached TSP) is manufactured and then externally attached to a display panel. Such TSP has high cost due to the cost and process complexity thereof, and has poor bending matching with existing flexible devices during bending process with a small radius. Therefore, much attention in current development has been devoted to integrating a flexible metal line on common (FMLOC) having touch functionality with a flexible device.

In the related art, referring to FIG. 1, since the FMLOC is provided on an encapsulation layer based on thin film encapsulation (TFE) and existing TFE encapsulation has a relatively large thickness, there is a step difference between a display area A and a bonding area C, which results in that patterns, that need to be removed, are hard to be removed completely in a transition area B and the bonding area C by a process including film formation, exposure and development, and etching. At the same time, in the existing product, peripheral leads of a backplane 1 generally use wirings of a source-drain layer or an anode layer, and in such case, a wiring layer 2 is usually exposed in the bonding area C. In a subsequent process of forming a connection layer 4, since there is an etching problem caused by the step difference and the FMLOC is of metal, no matter how a patterning process is performed, there is still serious under-etching residue in the peripheral leads, especially the wirings of the bonding area C. Residual connection layer metal is more likely to cause complexity and high risk of the process in the bonding area C.

Figure 2:
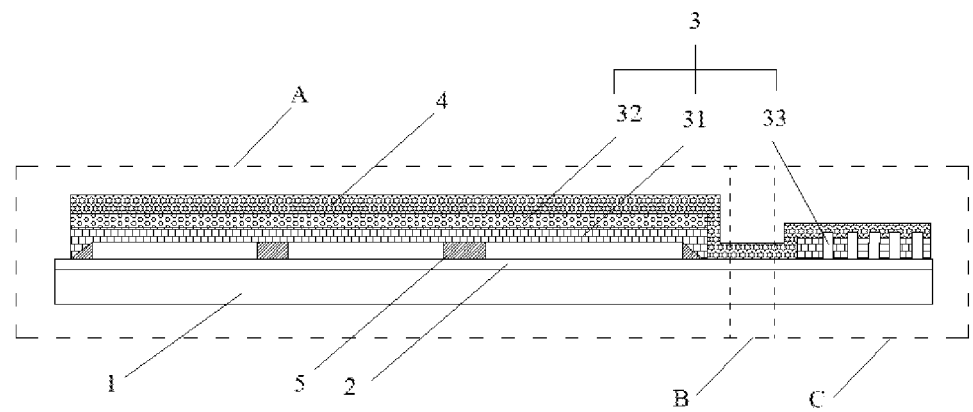
FIG. 2 is a schematic structural diagram of an array substrate with a first sub-protective layer covering a bonding area in an embodiment of the present disclosure.

First, the present disclosure provides an array substrate. Referring to FIG. 2, the array substrate may include a backplane 1, a wiring layer 2, a protective layer 3, and a connection layer 4. The backplane 1 includes a display area A and a bonding area C. The wiring layer 2 is provided on the backplane 1 and is exposed in the bonding area C. The protective layer 3 is provided on a surface of the wiring layer 2 away from the backplane 1, and covers the wiring layer 2 in the display area A and the bonding area C. A through-hole 33 is provided in the protective layer 3 in the boding area C. The connection layer 4 is provided on a surface of the protective layer 3 away from the backplane 1 and is coupled to the wiring layer 2 through the through-hole 33.

In the array substrate according to the present disclosure, the wiring layer 2 exposed in the bonding area C is covered by the protective layer 3 so that a height of the bonding area C is increased and thus, a step difference between the display area A and the bonding area C is reduced. The through-hole 33 is provided in the protective layer 3 in the boding area C so that the connection layer 4 is coupled to the wiring layer 2 through the through-hole 33. The protective layer 3 covers and protects the wiring layer 2 to prevent the metal of the connection layer 4 from being remained in an etching process for forming the connection layer 4 to result in short-circuit of the wiring layer 2, thereby lowering risk of short-circuit and improving safety of the array substrate.

In an example embodiment, referring to FIG. 2, the backplane 1 may include the display area A, a transition area B, and the bonding area C. The backplane 1 has a multi-layer structure. The backplane 1 may include a buffer layer, a gate insulation layer, a first gate layer, a second gate layer, an interlayer insulation layer, a planarization layer, a support layer, and the like.

Referring to FIG. 2, the wiring layer 2 may be one or more of a source-drain layer and an anode layer. The wiring layer is provided on the backplane 1 and is exposed in the bonding area C to be coupled to the connection layer 4 subsequently. The wiring layer 2 may include a plurality of wires. The wiring layer 2 is provided on the backplane 1 to cover the entire backplane 1, that is, to cover the display area A, the transition area B, and the bonding area C of the backplane 1.

Referring to FIG. 2, the protective layer 3 is provided on the wiring layer 2 and covers the wiring layer 2 in the display area A and the bonding area C. The protective layer 3 may include a first sub-protective layer 31 and a second sub-protective layer 32. The first sub-protective layer 31 may be formed by a chemical vapor deposition method, and the second sub-protective layer 32 may also be formed by the chemical vapor deposition method. The first sub-protective layer 31 is provided on the surface of the wiring layer 2 away from the backplane 1, and the second sub-protective layer 32 is provided on a surface of the first sub-protective layer 31 away from the backplane 1. That is, the first sub-protective layer 31 is provided on the wiring layer 2, and the second sub-protective layer 32 is provided on the first sub-protective layer 31. The second sub-protective layer 32 may only cover the wiring layer 2 in the display area A, and thus only by the first sub-protective layer 31, the step difference between the display area A and the bonding area C is reduced and the wiring layer 2 in the bonding area C is covered and protected.

Figure 3:
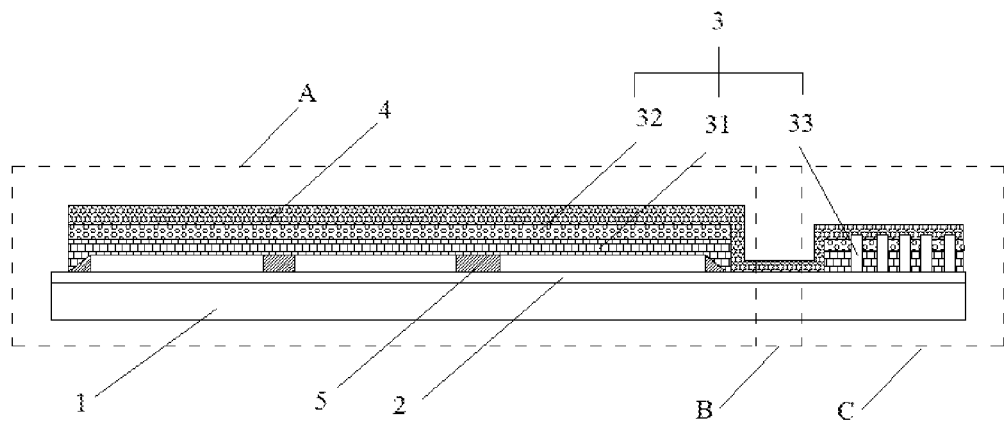
FIG. 3 is a schematic structural view of an array substrate with a first sub-protective layer and a second sub-protective layer covering a bonding area in an embodiment of the present disclosure.

Referring to FIG. 3, the second sub-protective layer 32 may also cover the wiring layer 2 in the display area A and the bonding area C, so that the step difference between the display area A and the bonding area C is further reduced.

The through-hole 33 is provided in the protective layer 3 in the bonding area C. That is, when the bonding area C is covered by the first sub-protective layer 31 and the second sub-protective layer 32, the through-hole 33 penetrates through the first sub-protective layer 31 and the second sub-protective layer 32; and when the second sub-protective layer 32 is only provided in the display area A, the through-hole 33 is only provided in the first sub-protective layer 31. A plurality of the through-holes 33 may be provided, and may correspond to wires of the wiring layer 2 one by one, that is, one through-hole 33 corresponds to one wire. It may also be possible that a plurality of wires correspond to one through-hole 33. A cross section shape of the through-hole 33 may be a circle, an ellipse, a rectangle, a triangle, or other shapes.

Figure 5:
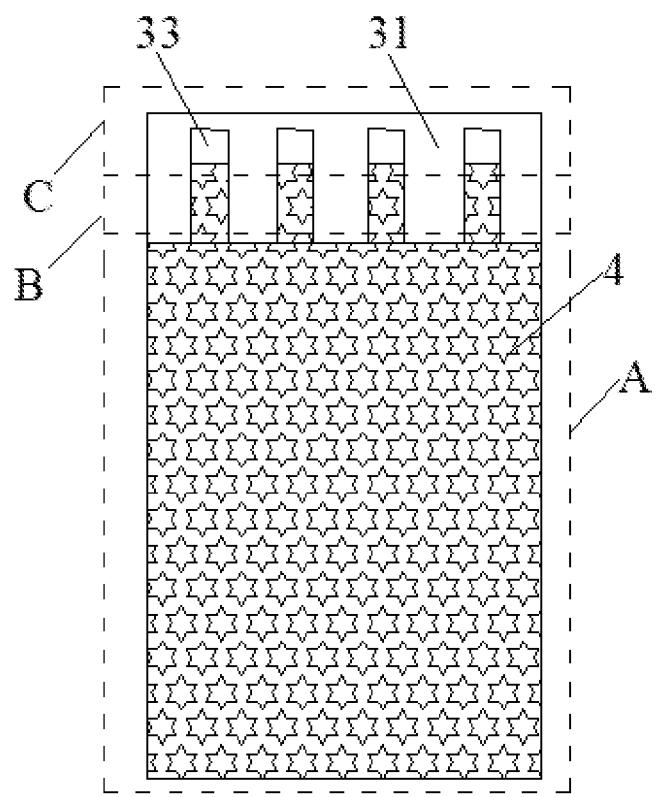
FIG. 5 is a plan view of an array substrate in an embodiment of the present disclosure.

Referring to FIGS. 2 and 5, the connection layer 4 is provided on the surface of the protective layer 3 far away from the backplane 1, that is, the connection layer 4 is provided on the protective layer 3. The connection layer 4 may be a flexible metal wire layer, and is coupled to the wiring layer 2 through the through-hole 33. The connection layer 4 is provided on the protective layer 3 in the display area A and the bonding area C. The connection layer 4 is also provided on the transition area B of the backplane 1, so that the connection layers 4 in the display area A and the bonding area C are coupled to each other and thus, both are coupled to the wiring layer 2. According to an embodiment of the present disclosure, the connection layer 4 may have a touch function. In such case, the connection layer 4 may include a touch electrode layer in the display area A and a touch electrode lead, which is extended from the touch electrode layer, goes through the transition area B, and is coupled to the wiring layer 2 via the through-hole 33 in the bonding area C.

Referring to FIG. 3, the array substrate according to the present disclosure may further include a pixel definition layer 5, which is provided on a surface of the wiring layer 2 away from the backplane 1, that is, the pixel definition layer 5 is provided on the wiring layer 2. The pixel definition layer 5 may cover only the wiring layer 2 in the display area A. The pixel definition layer 5 may define pixels in a display layer on the surface of the wiring layer 2 away from the backplane 1.

Figure 4:
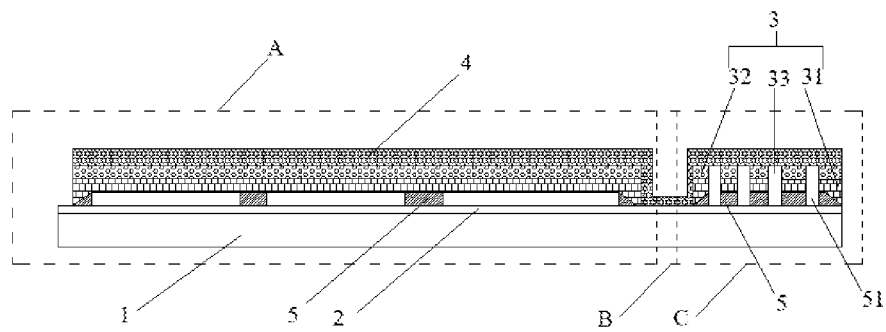
FIG. 4 is a schematic structural diagram of an array substrate with no step difference between a bonding area and a display area in an embodiment of the present disclosure.

Referring to FIG. 4, the pixel definition layer 5 may also cover the wiring layer 2 in the display area A and the bonding area B. In such case, a via-hole 51 is provided in the pixel definition layer 5 in the bonding area C to be communicated with the above through-hole 33. The via-hole 51 is communicated with the through-hole 33, and thus a plurality of the via-holes 51 may be also provided with a number that may be the same as that of the through-holes 33. A cross-section shape of the via-hole 51 may be a circle, an ellipse, a rectangle, a triangle, or other shapes.

Moreover, the present disclosure further provides a display panel, which may include the above-mentioned array substrate. The specific details of the array substrate have been described in detail above, therefore, they will not be repeated here.

Figure 6:
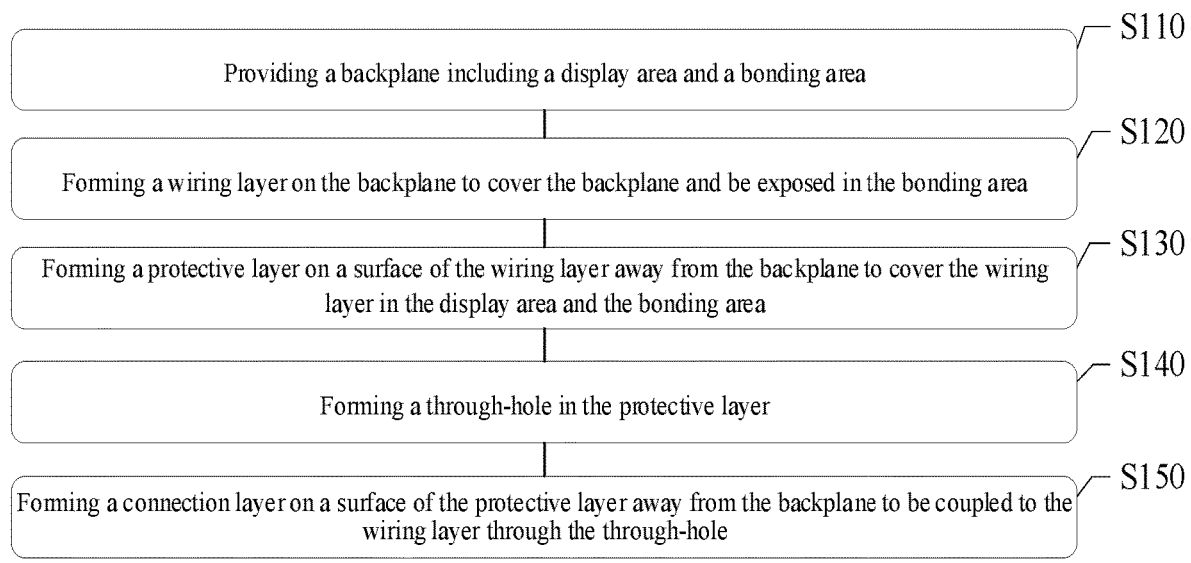
FIG. 6 is a flowchart of a method for manufacturing an array substrate of the present disclosure.

Further, the present disclosure also provides a method for manufacturing an array substrate. Referring to FIG. 6, the method for manufacturing the array substrate may include:

step S110, providing a backplane 1 including a display area A and a bonding area C;

step S120, forming a wiring layer 2 on the backplane 1 to cover the backplane 1 and be exposed in the boding area C;

step S130, forming a protective layer 3 on a surface of the wiring layer 2 away from the backplane 1 to cover the wiring layer 2 in the display area A and the bonding area C;

step S140, forming a through-hole 33 in the protective layer 3; and step S150, forming a connection layer 4 on a surface of the protective layer 3 away from the backplane 1 to be coupled to the wiring layer 2 through the through-hole 33.

Hereinafter, each step of the method for manufacturing the array substrate will be described in detail.

In step S110, the backplane 1 including the display area A and the bonding area C is provided.

Referring to FIG. 2, the backplane 1 is provided. The backplane 1 may include the display area A, a transition area B, and the bonding area C. The backplane 1 has a multi-layer structure. The backplane 1 may include a buffer layer, a gate insulation layer, a first gate layer, a second gate layer, an interlayer insulation layer, a planarization layer, a support layer, and the like.

In step S120, the wiring layer 2 is formed on the backplane 1 to cover the backplane 1 and be exposed in the boding area C.

Referring to FIG. 2, the wiring layer 2 is formed on the backplane 1. The wiring layer 2 may be one or more of a source-drain layer and an anode layer. The wiring layer 2 is provided on the backplane 1 and is exposed in the bonding area C to be coupled to the connection layer 4 subsequently. The wiring layer 2 may include a plurality of wires. The plurality of wires may be arranged in parallel, and distances between adjacent wires are the same. The wiring layer 2 is provided on the backplane 1 to cover the entire backplane 1, that is, to cover the display area A, the transition area B, and the bonding area C of the backplane 1.

In step S130, the protective layer 3 is formed on the surface of the wiring layer 2 away from the backplane 1 to cover the wiring layer 2 in the display area A and the bonding area C.

Referring to FIG. 2, the protective layer 3 is formed on the wiring layer 2 to cover the wiring layer 2 in the display area A and the bonding area C. The protective layer 3 may include a first sub-protective layer 31 and a second sub-protective layer 32. The first sub-protective layer 31 may be formed by a chemical vapor deposition method, and the second sub-protective layer 32 may also be formed by the chemical vapor deposition method. The first sub-protective layer 31 is provided on the surface of the wiring layer 2 away from the backplane 1, and the second sub-protective layer 32 is provided on a surface of the first sub-protective layer 31 away from the backplane 1. That is, the first sub-protective layer 31 is provided on the wiring layer 2, and the second sub-protective layer 32 is provided on the first sub-protective layer 31. The first sub-protective layer 31 covers the wiring layer 2 in the display area A and the bonding area C, and the second sub-protective layer 32 may only cover the wiring layer 2 in the display area A. Therefore, only by the first sub-protective layer 31, the step difference between the display area A and the bonding area C is reduced and the wiring layer 2 in the bonding area C is covered and protected.

Referring to FIG. 3, the second sub-protective layer 32 may also cover the wiring layer 2 in the display area A and the bonding area C, so that the step difference between the display area A and the bonding area C is further reduced.

In step S140, the through-hole 33 is formed in the protective layer 3.

Referring to FIGS. 2 and 3, the through-hole 33 is formed in the protective layer 3. The through-hole 33 is provided in the protective layer 3, and is provided on the wiring layer 2 in the bonding area C. That is, when the bonding area C is covered by the first sub-protective layer 31 and the second sub-protective layer 32, the through-hole 33 penetrates through the first sub-protective layer 31 and the second sub-protective layer 32 and, when the second sub-protective layer 32 is only provided in the display area A, the through-hole 33 is only provided in the first sub-protective layer 31. A plurality of the through-holes 33 may be provided, and may correspond to wires of the wiring layer 2 one by one, that is, one through-hole 33 corresponds to one wire. It may also be possible that a plurality of wires correspond to one through-hole 33. A cross section shape of the through-hole 33 may be a circle, an ellipse, a rectangle, a triangle, or other shapes.

In step S150, the connection layer 4 is formed on the surface of the protective layer 3 away from the backplane 1 to be coupled to the wiring layer 2 through the through-hole 33.

Referring to FIGS. 2 and 5, the connection layer 4 is formed on the protective layer 3. The connection layer 4 may be a flexible metal wire layer, and is coupled to the wiring layer 2 through the through-hole 33. The connection layer 4 is provided on the protective layer 3 in the display area A and the bonding area C. The connection layer 4 is also provided on the transition area B of the backplane 1, so that the connection layers 4 in the display area A and the bonding area C are coupled to each other and thus, both are coupled to the wiring layer 2. According to an embodiment of the present disclosure, the connection layer 4 may have a touch function. In such case, the connection layer 4 may include a touch electrode layer in the display area A and a touch electrode lead, which is extended from the touch electrode layer, goes through the transition area B, and is coupled to the wiring layer 2 via the through-hole 33 in the bonding area C.

Referring to FIGS. 3 and 4, the method for manufacturing the array substrate according to the present disclosure may further include forming a pixel definition layer 5 on a surface of the wiring layer 2 away from the backplane 1, that is, the pixel definition layer 5 is provided on the wiring layer 2. The pixel definition layer 5 may cover the wiring layer 2 in the display area A and the bonding area C. The pixel definition layer 5 may cover only the wiring layer 2 in the display area A.

Referring to FIG. 4, when the pixel definition layer 5 covers the wiring layer 2 in the display area A and the bonding area B, the method for manufacturing the array substrate according to the present disclosure may further include forming a via-hole 51 in the pixel definition layer 5 in the bonding area C to be communicated with the through-hole 33. A plurality of the via-holes 51 may be also provided with a number that may be the same as that of the through-holes 33. A cross-section shape of the via-hole 51 may be a circle, an ellipse, a rectangle, a triangle, or other shapes.

When the pixel definition layer 5, the first sub-protective layer 31, and the second sub-protective layer 32 are formed in the bonding region C, the via-hole 51 is provided in the pixel definition layer 5, the through-hole 33 is provided in the first sub-protective layer 31 and the second sub-protective layer 32, the via-hole 51 is communicated with the through-hole 33, the display area A and the bonding area C have a same stacking coverage, that is, the step difference between the display area A and the bonding area C is small or does not exist, and thus there will be few metal residues in the connection layer 4 due to the step difference when forming the connection layer 4. The connection layer 4 may be coupled to the wiring layer 2 through the via-hole 51 and the through-hole 33, and the wiring layer 2 exposed in the bonding area C is covered by the protective layer 3, therefore the exposed wiring layer 2 is not circuit-shorted due to the metal residuals, which lowers risk of short-circuit and improve safety of the array substrate.

The method for manufacturing an array substrate of the present disclosure may further include forming a display layer. The display layer is provided between the wiring layer 2 and the protective layer 3 in the display area A, and pixels are defined in the display layer by the pixel definition layer 5.

The features, structures, or characteristics described above may be combined in one or more embodiments in any suitable manner. If possible, the features discussed in the embodiments are interchangeable. In the above description, many specific details are provided to give a full understanding of the embodiments of the present invention. However, those skilled in the art will realize that the technical solutions of the present invention may be practiced without one or more of the specific details, or other methods, components, materials, etc. may be used. In other instances, well-known structures, materials, or operations have not been shown or described in detail to avoid obscuring aspects of the present invention.

Although relative terms such as "up" and "down" are used in the present specification to describe relative relationship between one component and another component shown, these terms are used in this specification only for convenience of description for example according to the example direction described. It can be understood that if the shown device is turned upside down, the component described as "on" will become the component "under". When a structure is "on" another structure, it may mean that the structure is integrally formed on the other structure, or that the structure is "directly" arranged on the other structure, or that the structure is arranged "indirectly" on the other structure through another structure.

In this specification, the terms "a", "an", "the", "said" and "at least one" are used to indicate the presence of one or more elements/components/etc.; the terms "including", "comprising" and "having" are intended to mean an open-ended inclusion and means that there can be additional elements/components/etc. in addition to the listed elements/components/etc.; the terms "first", "second", and "third" are only used as marks, not to limit the number of objects.

It should be understood that the present invention does not limit the application thereof to the detailed structure and arrangement of the components proposed in this specification. The present invention can have other embodiments, and can be implemented and executed in various ways. The aforementioned variations and modifications fall within the scope of the present invention. It should be understood that the present invention disclosed and defined in this specification extends to all alternative combinations of two or more individual features mentioned or obvious in the text and/or drawings. All of these different combinations constitute multiple alternative aspects of the invention. The embodiments described in this specification illustrate the best modes known for implementing the invention, and will enable those skilled in the art to utilize the invention.

What is claimed is:

1. An array substrate, comprising:
   a backplane comprising a display area, a bonding area, and a transition area provided between the display area and the bonding area;
   a wiring layer provided on the backplane;
   a protective layer provided on a surface of the wiring layer away from the backplane, and covering the wiring layer in the display area and the bonding area, wherein a through-hole is provided in the protective layer in the bonding area; and
   a connection layer arranged in the display area, the transition area, and the bonding area, provided on a surface of the protective layer away from the backplane, and coupled to the wiring layer through the through-hole, wherein the protective layer is not provided in the transition area.

2. The array substrate according to claim 1, further comprising:
   a pixel definition layer provided between the wiring layer and the protective layer, and covering the wiring layer in the display area or covering the wiring layer in the display area and the bonding area, wherein a via-hole is provided in the pixel definition layer in the bonding area to be communicated with the through-hole.

3. The array substrate according to claim 1, wherein the protective layer comprises:
   a first sub-protective layer covering the display area and the bonding area; and
   a second sub-protective layer covering the display area or covering the display area and the bonding area.

4. The array substrate according to claim 1, wherein a plurality of the through-holes are provided.

5. The array substrate according to claim 1, further comprising: a display layer provided between the wiring layer and the protective layer in the display area, wherein pixels are defined in the display layer by the pixel definition layer.

6. The array substrate according to claim 5, wherein the wiring layer comprises an electrode wiring and at least one of a source wiring and a drain wiring of a transistor for driving the display layer to emit light.

7. The array substrate according to claim 1, wherein the connection layer comprises:
   a touch electrode layer provided in the display area; and
   a touch electrode lead extended from the touch electrode layer and coupled to the wiring layer through the through-hole.

8. A display panel, comprising:
   an array substrate, wherein the array substrate comprises:
      a backplane comprising a display area, a bonding area, and a transition area provided between the display area and the bonding area;
      a wiring layer provided on the backplane;
      a protective layer provided on a surface of the wiring layer away from the backplane, and covering the wiring layer in the display area and the bonding area, wherein a through-hole is provided in the protective layer in the bonding area; and
      a connection layer arranged in the display area, the transition area, and the bonding area, provided on a surface of the protective layer away from the backplane, and coupled to the wiring layer through the through-hole, wherein the protective layer is not provided in the transition area.

9. A method for manufacturing an array substrate, comprising:
   providing a backplane comprising a display area, a bonding area, and a transition area provided between the display area and the bonding area;
   forming a wiring layer on the backplane to cover the backplane;
   forming a protective layer on a surface of the wiring layer away from the backplane to cover the wiring layer in the display area and the bonding area;
   forming a through-hole in the protective layer in the bonding area; and
   forming a connection layer on a surface of the protective layer away from the backplane to be coupled to the wiring layer through the through-hole, wherein the connection layer is formed in the display area, the transition area, and the bonding area, and the protective layer is not provided in the transition area.

10. The method for manufacturing an array substrate according to claim 9, further comprising, after forming the wiring layer:
   forming a pixel definition layer on a surface of the wiring layer away from the backplane to cover the wiring layer in the display area or cover the wiring layer in the display area and the bonding area; and
   forming a via-hole in the pixel definition layer in the bonding area to be communicated with the through-hole.

11. The method for manufacturing an array substrate according to claim 9, wherein forming the protective layer on the surface of the wiring layer away from the backplane comprises:
   forming a first sub-protective layer on the surface of the wiring layer away from the backplane to cover the display area and the bonding area; and
   forming a second sub-protective layer on a surface of the first sub-protective layer away from the backplane to cover the display area or cover the display area and the bonding area.

12. The method for manufacturing an array substrate according to claim 10, further comprising forming a display layer, wherein the display layer is provided between the wiring layer and the protective layer in the display area, and pixels are defined in the display layer by the pixel definition layer.

13. The method for manufacturing an array substrate according to claim 12, wherein the wiring layer comprises an electrode wiring and at least one of a source wiring and a drain wiring of a transistor for driving the display layer to emit light.

14. The method for manufacturing an array substrate according to claim 9, wherein the connection layer comprises:
   a touch electrode layer provided in the display area; and
   a touch electrode lead extended from the touch electrode layer and coupled to the wiring layer through the through-hole.

15. The display panel according to claim 8, wherein the array substrate further comprises a pixel definition layer provided between the wiring layer and the protective layer, and covering the wiring layer in the display area or covering the wiring layer in the display area and the bonding area, wherein a via-hole is provided in the pixel definition layer in the bonding area to be communicated with the through-hole.

16. The display panel according to claim 8, wherein the protective layer comprises:
   a first sub-protective layer covering the display area and the bonding area; and
   a second sub-protective layer covering the display area or covering the display area and the bonding area.

17. The display panel according to claim 8, wherein the array substrate further comprises a display layer provided between the wiring layer and the protective layer in the display area, wherein pixels are defined in the display layer by the pixel definition layer.

18. The display panel according to claim 8, wherein the connection layer comprises:
   a touch electrode layer provided in the display area; and
   a touch electrode lead extended from the touch electrode layer and coupled to the wiring layer through the through-hole.

* * * * *